(12) United States Patent
Hult

(10) Patent No.: US 7,388,647 B2
(45) Date of Patent: Jun. 17, 2008

(54) METHOD AND SYSTEM FOR REAL TIME UNIFORMITY FEEDBACK

(75) Inventor: David A. Hult, Danbury, CT (US)

(73) Assignee: ASML Holding N.V., Veldhoven (NL)

( * ) Notice: Subject to any disclaimer, the term of this patent is extended or adjusted under 35 U.S.C. 154(b) by 266 days.

(21) Appl. No.: 11/029,510

(22) Filed: Jan. 6, 2005

(65) Prior Publication Data

US 2006/0146309 A1 Jul. 6, 2006

(51) Int. Cl.
*G03B 27/42* (2006.01)

(52) U.S. Cl. .......................... 355/53; 355/67

(58) Field of Classification Search ................ 355/53, 355/69, 67, 77
See application file for complete search history.

(56) References Cited

U.S. PATENT DOCUMENTS

| | | | | |
|---|---|---|---|---|
| 5,006,886 A | * | 4/1991 | Suzuki | 355/46 |
| 5,714,749 A | * | 2/1998 | Yonezawa et al. | 250/201.2 |
| 5,991,004 A | * | 11/1999 | Wallace et al. | 355/53 |
| 6,091,481 A | * | 7/2000 | Mori | 355/67 |
| 6,833,906 B1 | * | 12/2004 | Ohsaki | 355/69 |

* cited by examiner

*Primary Examiner*—D. Rutledge
(74) *Attorney, Agent, or Firm*—Sterne, Kessler, Goldstein & Fox PLLC

(57) ABSTRACT

Provided are a method and system for projecting an illumination beam to an image plane. The method includes producing a sample of the illumination beam and projecting the sample to a secondary image plane. Next, an illumination uniformity profile associated with the projected sample is measured while the received illumination beam is being projected to the image plane.

30 Claims, 7 Drawing Sheets

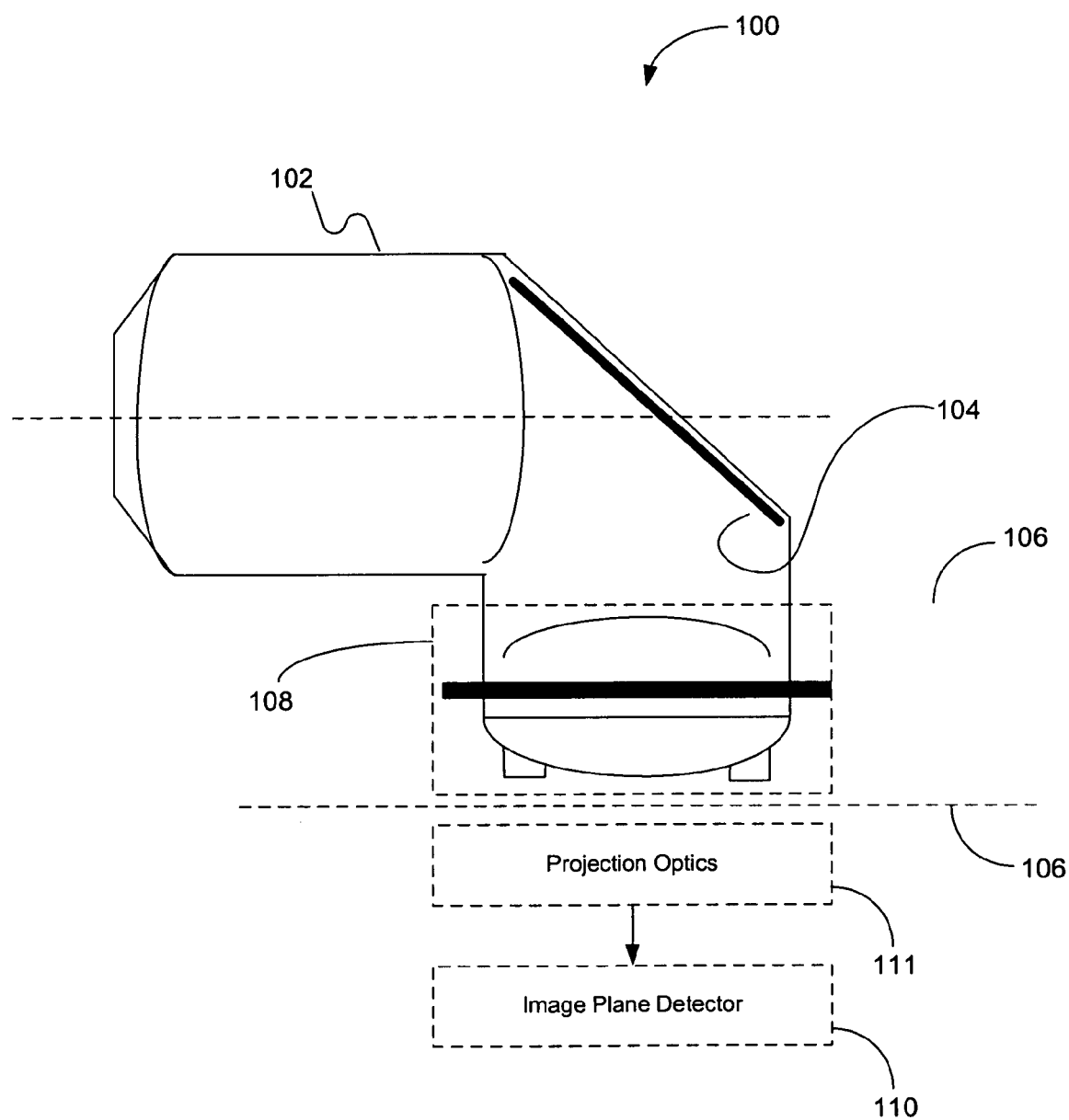
FIG. 1
(conventional)

METHOD AND SYSTEM FOR REAL TIME UNIFORMITY FEEDBACK

BACKGROUND OF THE INVENTION

1. Field of the Invention

The present invention relates generally to uniformity corrections in lithography systems.

2. Related Art

Conventional lithography systems include, among other things, an illumination system to produce a uniform intensity distribution of a received laser beam. It is desirable that the resulting illumination be as uniform as possible. Illumination uniformity influences the lithography system's ability to pattern uniform line widths across an entire exposure field. Illumination uniformity can significantly impact the quality of devices produced by the lithography system.

In conventional illumination systems, uniformity is never measured during an actual exposure, but can only be measured offline. That is, these conventional illumination systems do not include methods for actively and dynamically controlling illumination uniformity with real time uniformity measurements (or feedback).

Transient uniformity disturbances, have been observed in radiometric illumination tests. Factors, such as beam and component misalignment and/or transmission hysteresis, are example as sources of transient uniformity disturbances. In lithography systems that utilize light wavelengths of about 193 nanometers, for example, transmission hysteresis within the illuminator can cause uniformity to change by up to 0.15% (half of the specification for a typical lithography system) during the space of 90 minutes in some extreme cases. In conventional systems, uniformity of exposure is entrusted to the temporal stability of the optical system.

Conventional techniques for correcting uniformity errors include numerous systems that are well known to those of skill in the art. These illumination uniformity systems are configured to correct uniformity only at a wafer plane. Uniformity corrections are made, re-measured, then saved, and exposures are conducted without further adjustment. Particular correction settings may also be recorded for later use. In short, these systems are only capable of measuring illumination uniformity statically (i.e., off line). These systems do not include capabilities for dynamically measuring illumination uniformity at or near real time.

What is needed, therefore, is a method and system that provides real time uniformity illumination measurements and intensity feedback. More specifically, what is needed is a technique and system to measure illumination uniformity in real time in an image plane.

SUMMARY OF THE INVENTION

Consistent with the principles of the present invention as embodied and broadly described herein, the present invention includes a method to project an illumination beam to an image plane. The method includes producing a sample of the illumination beam and projecting the sample to a secondary image plane. Next, an illumination uniformity profile associated with the projected sample is measured while the received illumination beam is being projected to the image plane.

Further features and advantages of the present invention as well as the structure and operation of various embodiments of the present invention, are described in detail below with reference to the accompanying drawings.

BRIEF DESCRIPTION OF THE DRAWINGS

The accompanying drawings, which are incorporated herein and constitute part of the specification, illustrate embodiments of the present invention and, together with the general description given above and the detailed description of the embodiments given below, serve to explain the principles of the invention. In the drawings:

FIG. 1 is an illustration of a conventional optical relay and projection system without real time uniformity feedback;

DETAILED DESCRIPTION OF THE INVENTION

Figure 2:
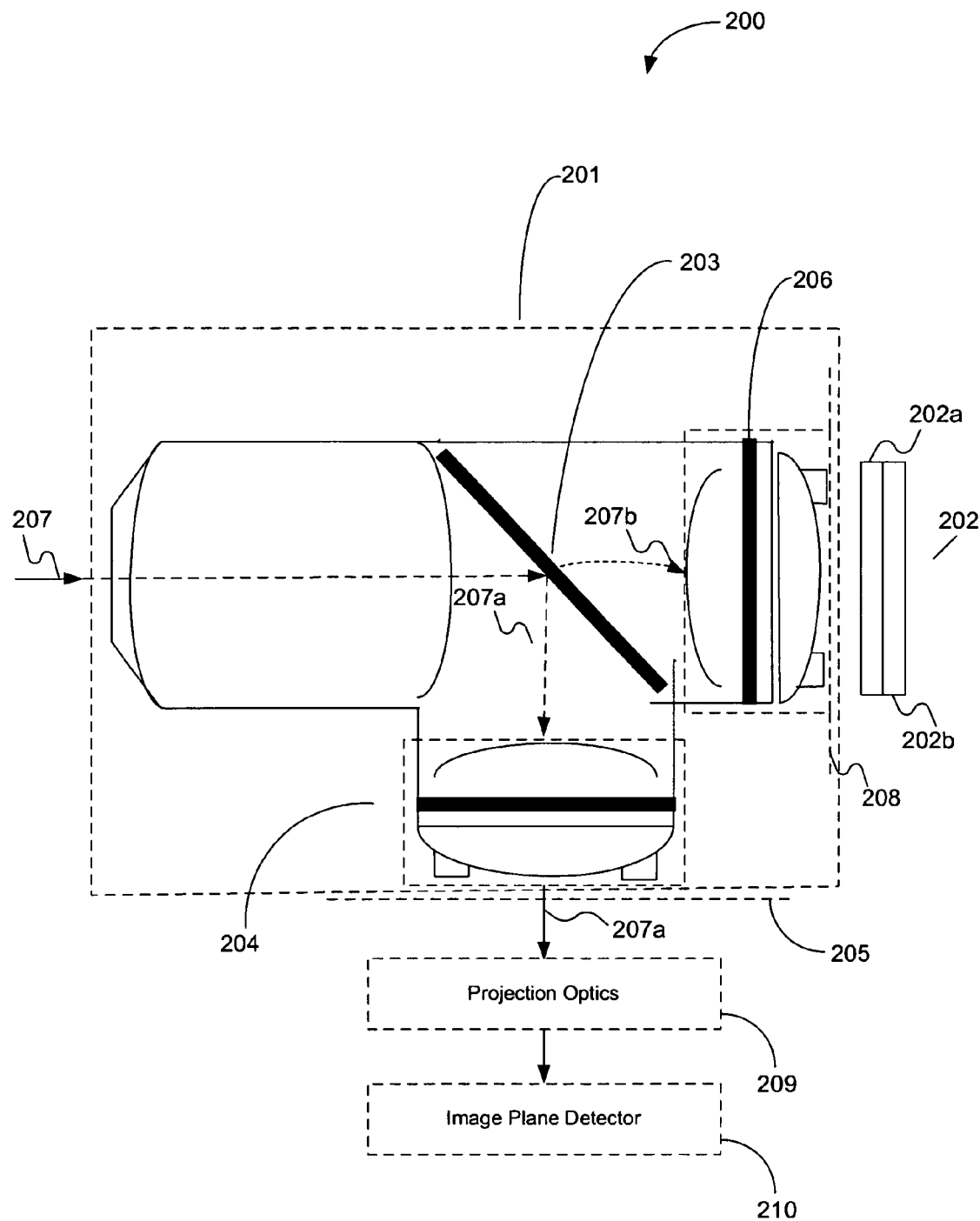
FIG. 2 is an illustration of an exemplary optical relay and projection system constructed and arranged in accordance with an embodiment of the present invention.

The following detailed description of the present invention refers to the accompanying drawings that illustrate exemplary embodiments consistent with this invention. Other embodiments are possible, and modifications may be made to the embodiments within the spirit and scope of the invention. Therefore, the following detailed description is not meant to limit the invention. Rather, the scope of the invention is defined by the appended claims.

It would be apparent to one skilled in the art that the present invention, as described below, may be implemented in many different embodiments of hardware, software, firmware, and/or the entities illustrated in the drawings. Any actual software code with the specialized controlled hardware to implement the present invention is not limiting of the present invention. Thus, the operation and behavior of the present invention will be described with the understanding that modifications and variations of the embodiments are possible, given the level of detail presented herein.

FIG. 1 is an illustration of a conventional optical system 100 that does not provide real time uniformity feedback. The optical 100 is one component of an overall baseline illumination system (not shown). The optical system 100 includes an illumination beam relay area 102 and a 100% reflective fold mirror 104. The optical system 100 also includes a field lens group 108. Also shown is an image plane detector 110 communicably coupled to projection optics 111.

In the conventional optical system 100, illumination is corrected between the relay area 102 and the object plane 106 based on uniformity measurements made by the image plane detector 110. In the optical system 100, the uniformity measurement by the image plane detector 110 can be performed using the conventional uniformity correction systems. The detector 110 is placed in the image plane when a wafer is not present. The detector 110 detects the output illumination at the image plane. One drawback with using these systems is that uniformity measurements can only be made offline, when a wafer is not being exposed.

Uncorrected illumination uniformity errors can result in the production of microelectronic devices, or other devices, that are not uniform across the entire chip, adversely impacting device speeds and yield. When illumination uniformity errors are kept low, on the other hand, the lithography system is able to produce better quality devices, enabling these devices to operate more efficiently and at higher speeds. Many factors can contribute to illumination uniformity errors, such as the vibration of optical components, geometric effects in these components, and transmission hysteresis.

By way of background, transmission hysteresis is a material property in optical elements that can cause drift in the signature of the illumination beam if illumination modes are changed. These effects can also be created if different parts of the illumination field are being illuminated. As noted above, the effects of the transmission hysteresis within the illuminator have been observed to cause uniformity to change by up to 0.15% in some extreme situations.

Transient uniformity disturbances are also a factor in illumination uniformity errors. For example, if one or more of the mirrors steering the beam into a lithography tool includes geometric defects or is mechanically vibrating or otherwise changing its shape due to heating during an illumination event, the pointing of this mirror may be inaccurate. This inaccuracy will cause the beam to change shape, change position, or change angles within an associated aperture, thus creating transient uniformity affects.

Conventional lithography systems can only measure illumination uniformity errors offline, during time periods when wafers are not printing.

These offline error correction techniques, while providing a level of error correction, still allow measurable levels of illumination uniformity errors to occur during exposure. As noted above, these errors result in device non-uniformity which in turn reduces device performance and production/manufacturing device yields.

FIG. 2 is an illustration of an exemplary optical system 200 according to an embodiment of the present invention. In FIG. 2, the optical system 200 includes a relay 201 and a uniformity analyzer/processor module 202, configured to measure uniformity during an exposure. The relay 201 includes an optical component 203 configured to sample an input illumination beam near an image plane. The optical component 203 can be, for example, a leaky mirror. As understood by those of skill in the art, a leaky mirror is a mirror with less than 100% reflectivity and transmission greater than zero. The optical component 203, while reflecting some energy, allows samples of the beam to pass from one side of the optical component 203 to another side of the optical component 203. Also included in the relay 201 is a field lens group 204 (also called a primary field lens group). The relay 201 includes a secondary (duplicate) field lens group 206.

The optical component 203 and the duplicate field lens group 206 cooperate to facilitate real time (dynamic) illumination error correction during an exposure. For example, when a beam 207 is projected into the relay 201, a portion 207a of the laser beam is reflected by the optical component 203 into the primary field lens group 204. At the same time, however, another portion 207b of projected beam 207 passes through the optical component 203 and is projected by the duplicate field lens group 206 to uniformity analyzer/processor module 202.

The other portion 207b (beam sample) can then be analyzed to determine an illumination uniformity profile associated with the relay 201. The illumination uniformity profile will include not only a measure of illumination uniformity errors, but can also include other illumination characteristics such as integrated intensity coming from the laser beam and influenced by other illumination components.

The illumination uniformity profile, along with other characteristics associated with the sample 207b, can be measured at a secondary object plane 208.

The uniformity analyzer/processor module 202 can include an array that uses techniques such as scanning or rastering to detect and measure the illumination uniformity profiles associated with the sample 207b. At the same time the sample 207b is being measured, the other portion 207a of the received illumination beam 207 is being projected through the primary field lens group 204 to a primary object plane 205, and through projection optics 209 to an image plane. The illumination uniformity errors can consequently cause non-uniform illumination of the reticle and, in turn, non-uniform illumination of the wafer, as noted above.

The function of the uniformity analyzer/processor module 202 can be provided, for example, by an off the shelf charge coupled device (CCD) camera 202a. The uniformity computations can be performed via hardware, software, or a combination thereof For example, the CCD camera 202a can be coupled to a standard computer processor 202b. In the present example, the computer processor 202b will perform the uniformity computations. The CCD camera 202a is preferably equipped with a sufficient number of pixels to enable the device to detect at a desirable field size with adequate resolution. While the present invention is not restricted to any particular field size, an exemplary CCD detector would be able to detect approximately 100 millimeters. The present invention is not limited to use of a CCD camera and other types of detectors can be used.

Figure 3:
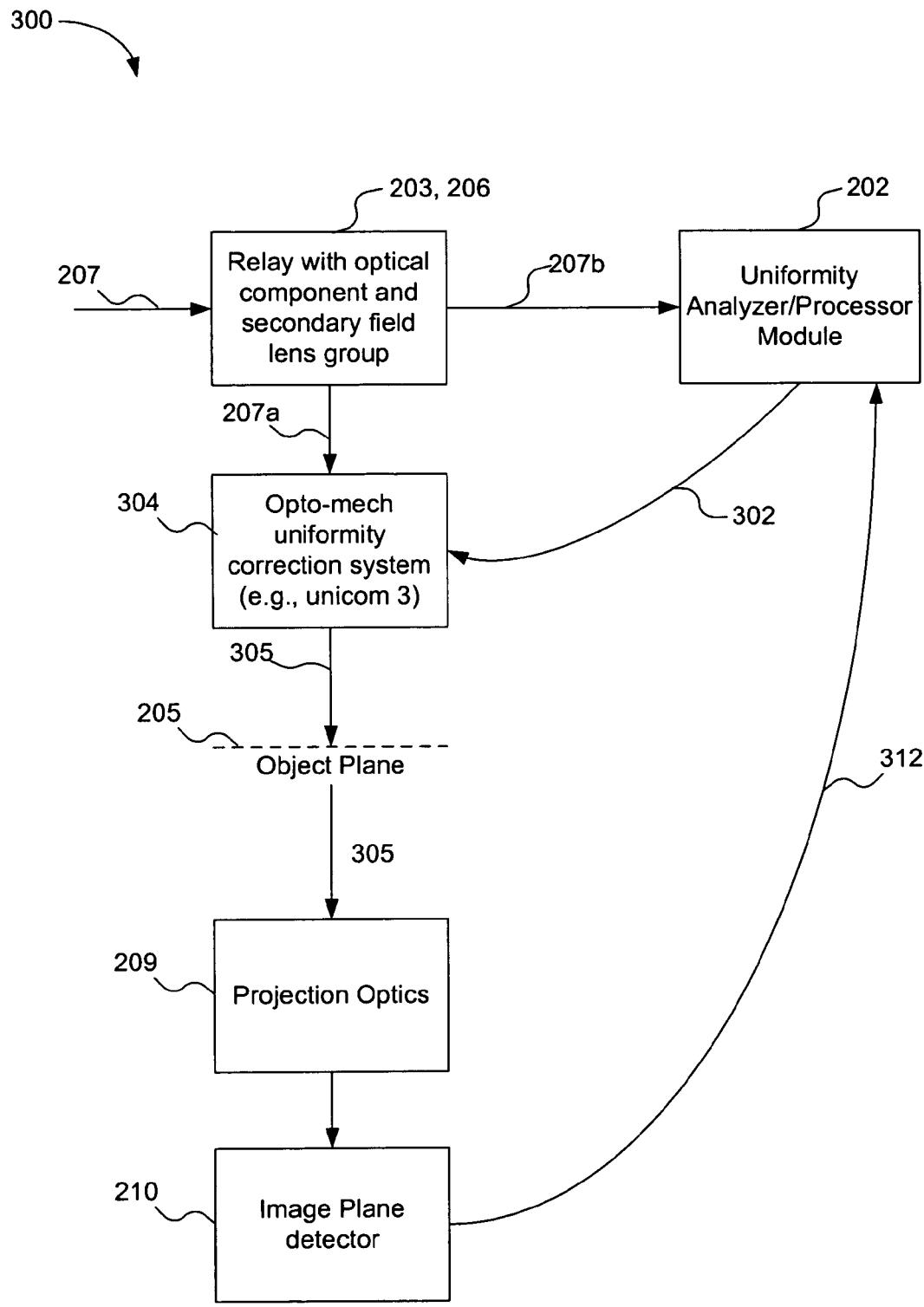
FIG. 3 is a block diagram illustration of an optical relay and projection system having correction mechanisms and real time uniformity feed-forward in accordance with an embodiment of the present invention.

FIG. 3 is a block diagram illustration of a higher level optical system 300 that is integrated with the optical system 200. Other optical components are also included that can be used to measure and correct illumination uniformity errors. In FIG. 3, the optical component 203 is configured to receive the projected illumination beam 207. As noted above, the first portion 207a of the illumination beam 207 is reflected by the optical component 203. The second portion (sample) 207b of the illumination beam 207, however, passes through the optical component 203 and forms the illumination beam sample 207b. The sample 207b is projected by the second field lens group 206 to the uniformity analyzer/processor module 202. The sample 207b is then detected by the uniformity analyzer/processor module 202.

The uniformity analyzer/processor module 202 continuously measures the illumination uniformity profile of the illumination sample 207b. At the same time, however, the first portion 207a of the illumination beam 207 is projected through an opto-mechanical uniformity correction system 304, to the primary object plane 205. During an exposure to the illumination beam 207a, the projection optics 209 will in turn project the image to the wafer. During periods of offline uniformity error measurements, however, the wafer is replaced with an image plane detector 210 so the extent of any actual uniformity errors can be measured.

The uniformity analyzer/processor module 202 analyzes the energy distribution associated with the illumination sample 207b. By measuring the energy associated with the illumination sample 207b, the uniformity analyzer/processor module 202 is able to accurately determine the illumination profiles associated with the sample 207b. After sensing, detecting, and measuring the illumination profiles associated with the sample 207b, the uniformity analyzer/processor module 202 then provides correcting instructions 302 to the opto-mechanical uniformity correction system 304.

The opto-mechanical uniformity correction system 304 can include, for example, traditional well known turn-key uniformity corrections systems for correcting illumination uniformity. The opto-mechanical uniformity correction system 304 is a mechanical device that is responsible for actually controlling illumination levels within specific sections of illumination fields associated with the system 300. The specific functional details of the traditional turn-key correction systems are well known to those skilled in the art and need not be further explained herein. Thus, based upon the measurement by the uniformity analyzer/processor module 202 of the illumination sample 207b, the instructions 302, including correction parameters, are forwarded to the opto-mechanical uniformity correction system 304. These correction parameters control adjustable components with the correction system 304, such as blades and/or filters.

Through manipulation of the adjustable components of the correction system 304 in accordance with the correction instructions 302, characteristics of the illumination beam 207a are changed. More specifically, the correction instructions 302 provides details of how to change positions of the blades or filters in the uniformity correction system 304, or other opto-mechanical uniformity correction systems, in order to achieve a desired profile. A corrected illumination beam 305 is then projected to the object plane 205.

As noted above, the image plane detector 210 is periodically illuminated in order to determine the extent and effect of corrections applied by the opto-mechanical uniformity correction system 304. That is, the image plane detector 210 can see the effect of the opto-mechanical uniformity correction system 304 and can verify that this system is configured and operating appropriately to provide the proper corrections for the corrected illumination beam 305. The image plane detector 210 is only inserted periodically because its insertion requires the removal of the wafer.

Once the image plane detector 210 has sampled the corrected illumination beam 305, the image plane detector 210 is removed, the wafer is reinserted, and wafer printing continues. The measurements provided by the image plane detector 210 are performed to calibrate the uniformity analyzer/processor module 202 along a feedback path 312 using a process known as detector mapping. The detector mapping along the feedback path 312 provides a measurement for calibration of what the uniformity analyzer/processor module 202 (e.g., image plane detector), should be seeing since the uniformity analyzer/processor module 202 will not necessarily see a perfectly uniform field.

In this manner, the image plane uniformity analyzer/processor module 202, the image plane detector 210, and the detector mapping along the feedback path 312 cooperate to calibrate the opto-mechanical uniformity correction system 304. This process enables dynamic correction of uniformity error in real time.

Figure 4A:
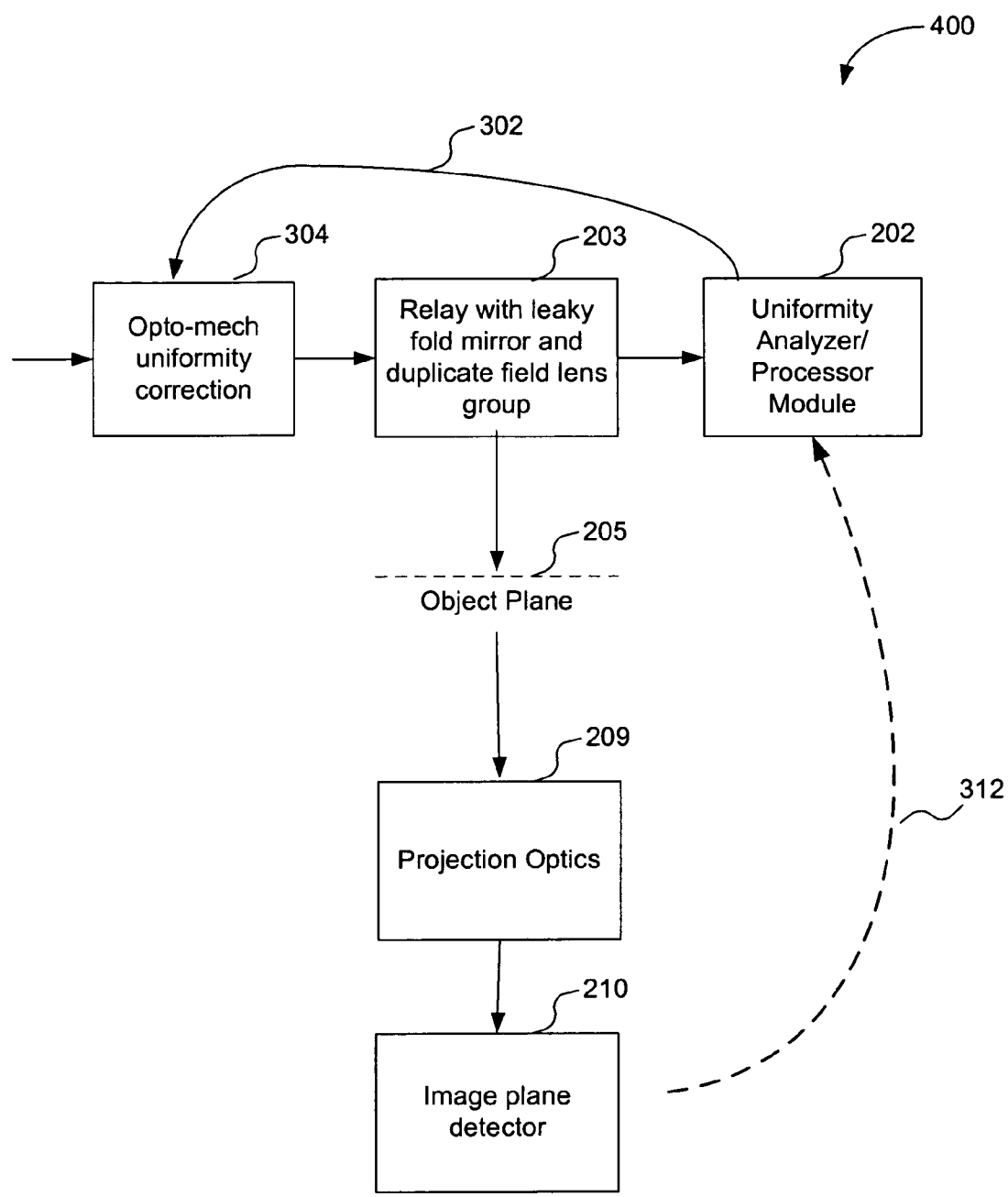
FIG. 4A is a block diagram of an optical relay and projection system having real time uniformity feedback and correction mechanisms in accordance with another embodiment the present invention.

FIG. 4A is a block diagram illustration of an optical system 400 including the opto-mechanical uniformity correction system 304 positioned in front of the optical component 203. This arrangement provides continuous feedback based upon the illumination profile or corrected data from the uniformity analyzer/processor module 202. The arrangement of the system 400 is similar to normal feedback that is typically used in control circuits. Thus, this approach is less dependent upon optical models and the other traditional turn-key correction tools.

In the embodiment of FIG. 3, the opto-mechanical uniformity correction system 304 provides an estimation of the corrections made by other components of the system 300. In FIG. 4, the system 400 feeds back the correction instructions 302 to the opto-mechanical uniformity correction system 304. The opto-mechanical uniformity correction system 304 then creates a uniformity illumination profile at the uniformity analyzer/processor module 202.

Figure 4B:
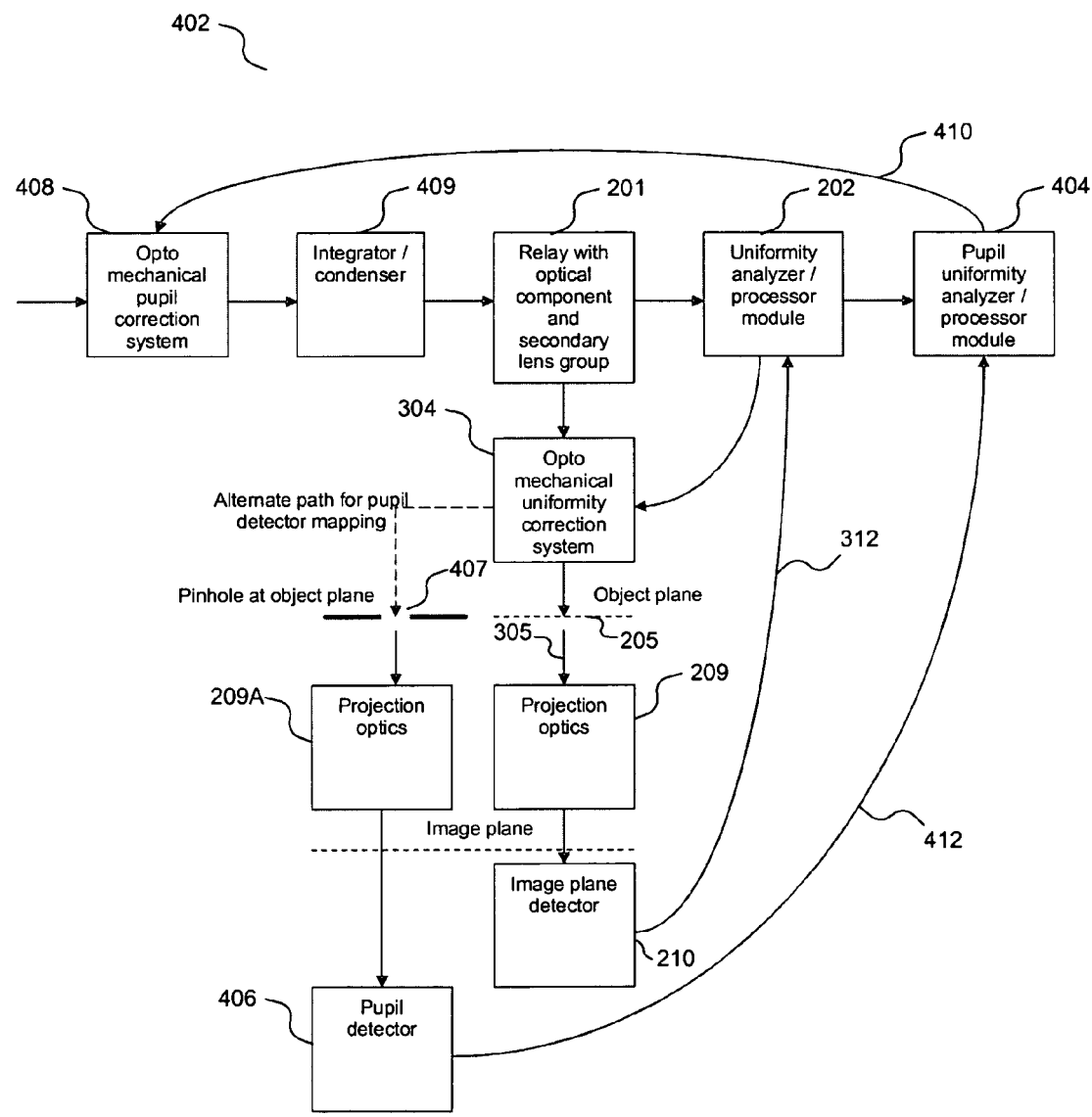
FIG. 4B is a variation of the system shown in FIG. 4A and represents yet another embodiment of the present invention.

FIG. 4B is yet another embodiment of the present invention. In FIG. 4B, a system 402 includes a pupil uniformity analyzer/processor module 404. The pupil uniformity analyzer/processor module 404 can include an array that uses techniques such as scanning or rastering to detect and measure illumination pupils associated with the second portion 207b of the illumination beam 207 of FIG. 2. At the same time the sample 207b is being measured, the first portion 207a of the received illumination beam 207 is being projected through the primary field lens group 204 to a primary object plane 205 and through the projection optics 209 to a pupil detector 406. The pupil uniformity errors can consequently degrade imaging performance at the wafer.

The pupil uniformity analyzer/processor module 404 is illuminated with the sample 207b through a pinhole in uniformity analyzer/processor module 202 at a secondary object plane (alternate designs may include a lens, a mirror, or a system of lenses and/or mirrors to project the illumination sample 207b to a pupil plane). The use of the pinhole in uniformity analyzer/processor module 202 (or system of optical components), for example, to project an illumination pupil is well known to those skilled in the art The function of the pupil uniformity analyzer/processor module 404 can be provided, for example, by an off the shelf CCD camera, such as the CCD camera 202a, shown in FIG. 2. Pupil uniformity computations can be performed via hardware, software, or a combination thereof. For example, the CCD camera 202a can be coupled to a standard computer processor 202b. In the present example, the computer processor 202b will perform the pupil uniformity computations.

The CCD camera 202a is preferably equipped with a sufficient number of pixels to enable the device to detect at a desirable pupil size with adequate resolution. While the present invention is not restricted to any particular pupil size, an exemplary CCD detector associated with the CCD camera 202a can desirably detect approximately 10 millimeters. The present invention is not limited to use of a CCD camera and other types of detectors can be used.

The system 402 of FIG. 4B also includes an exemplary opto-mechanical pupil uniformity correction system 408 providing an input to an integrator/condenser 409. The opto-mechanical pupil uniformity correction system 408 can include, for example, traditional well known turn-key pupil uniformity corrections systems for correcting pupil uniformity. The opto-mechanical pupil uniformity correction system 408 is a mechanical device that is responsible for actually controlling illumination levels within specific sections of illumination pupils associated, for example, with the system 300.

The specific functional details of the traditional turn-key correction systems are well known to those skilled in the art and need not be further explained herein. Thus, based upon the measurement by the pupil uniformity analyzer/processor module 404 of the illumination sample 207b, the instructions 410, including correction parameters, are forwarded to the opto-mechanical pupil uniformity correction system 408.

These correction parameters control adjustable components within the correction system 408, such as wires, blades and/or filters.

Through manipulation of the adjustable components of the pupil uniformity correction system 408 in accordance with the correction instructions 410, characteristics of the illumination beam 207a are changed. More specifically, the correction instructions 410 provides details of how to change positions of the blades or filters in the pupil uniformity correction system 408, or other opto-mechanical pupil uniformity correction systems, in order to achieve a desired pupil profile. A corrected illumination beam 305 is then projected to the object plane 205.

The pupil detector 406 is periodically illuminated through the pinhole 408 at the image (or object) plane 205 in order to determine the extent and effect of corrections applied by the opto-mechanical pupil uniformity correction system 408. That is, the pupil detector 406 can see the effect of the opto-mechanical pupil uniformity correction system 408 and can verify that this system is configured and operating appropriately to provide the proper corrections for the corrected illumination beam 305. The pupil detector 406 is only inserted periodically because its insertion requires the removal of the wafer.

Once the pupil detector 406 has sampled the corrected illumination beam 305, the pupil detector 406 can be removed, the wafer is reinserted, and wafer printing continues. The measurements provided by the pupil detector 406 are performed to calibrate the pupil uniformity detection module 404 along a feedback path 412 using a process known as detector mapping. The detector mapping along the feedback path 412 provides a measurement for calibration of what the pupil uniformity analyzer/processor module 404 (e.g., the pupil detector 406), should be seeing since the pupil uniformity analyzer/processor module 404 will not necessarily see a perfectly uniform pupil, because of different camera signatures and optical differences between the two measurement positions.

In this manner, the pupil uniformity analyzer/processor module 404, the pupil detector 406, and the detector mapping along the feedback path 412 cooperate to calibrate the opto-mechanical pupil uniformity correction system 408. This process enables dynamic correction of pupil uniformity error in real time.

Figure 5:
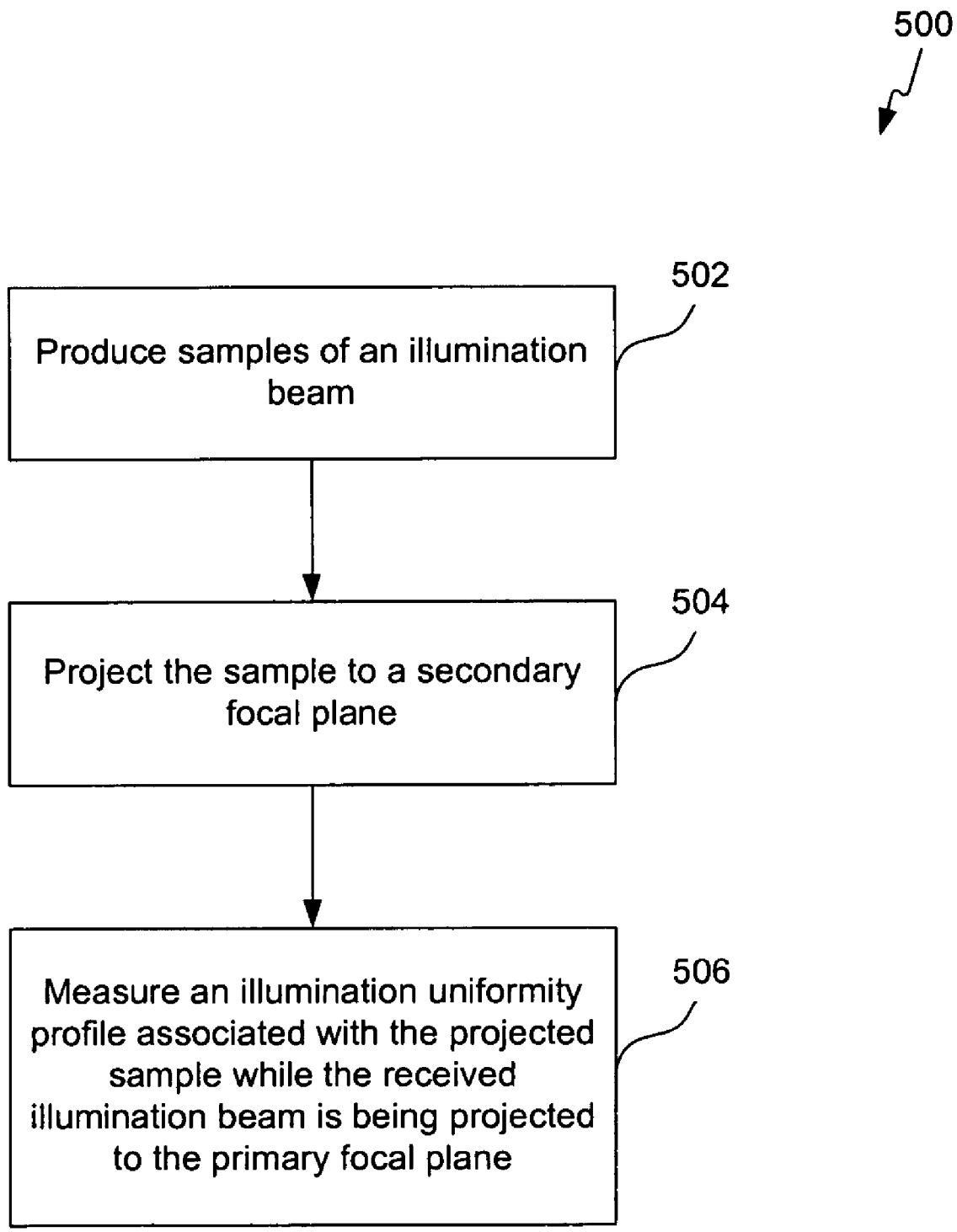
FIG. 5 is a flowchart of an example method of practicing an embodiment of the present invention.

FIG. 5 is a flowchart of an exemplary method 500 of practicing an embodiment of the present invention. In FIG. 5, a sample of the received illumination beam is produced, as indicated in step 502. Next, as indicated in step 504 the sample is projected to a secondary image plane. In step 506, an illumination uniformity profile associated with the projected sample is measured while the received illumination beam is being projected to the image plane.

Aspects of the present invention can be implemented in software, hardware, or as a combination thereof. These aspects of the present invention may be implemented in the environment of a computer system or other processing system. An example of such a computer system 600 is shown in FIG. 6.

Figure 6:
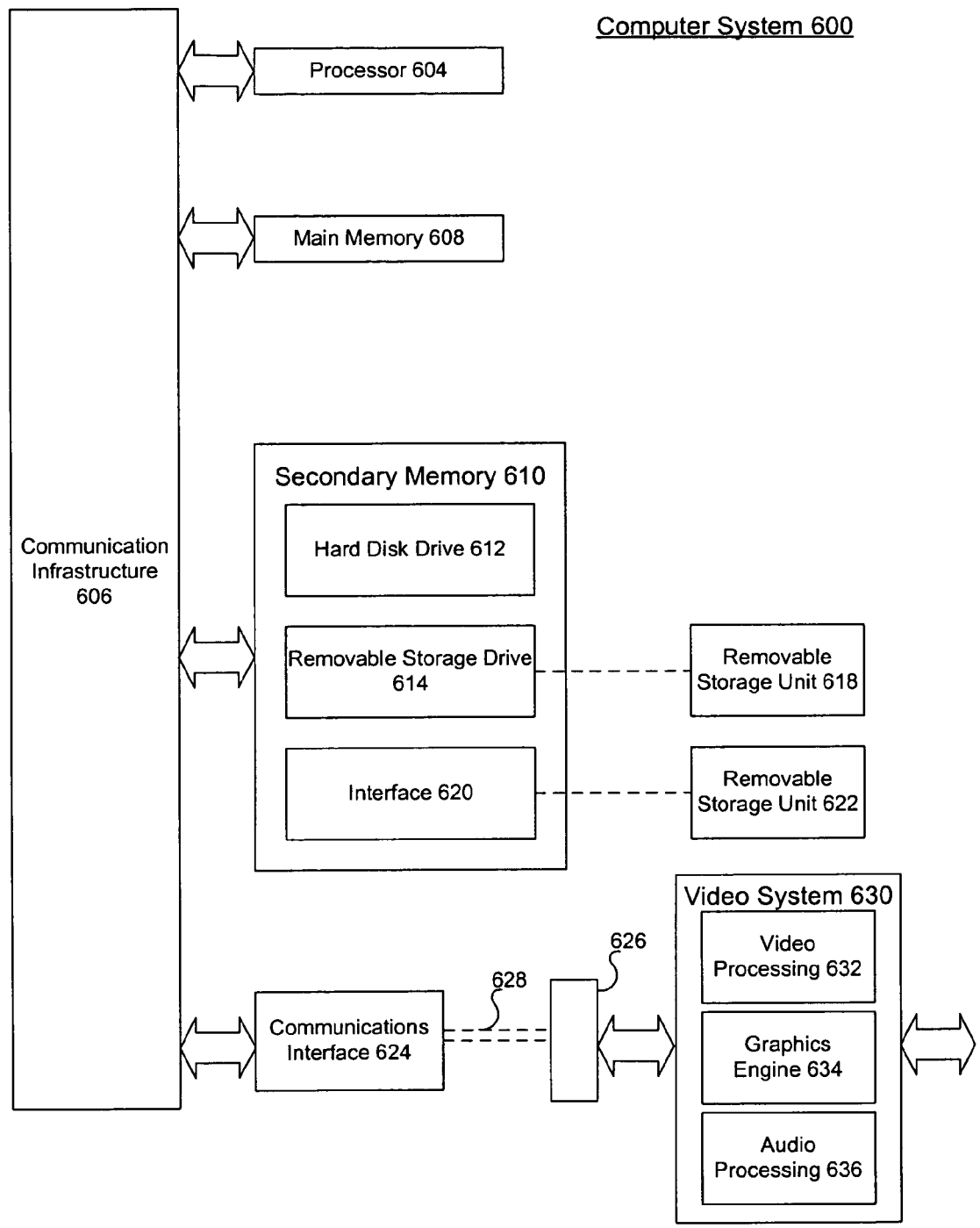
FIG. 6 is a block diagram of an example computer system on which the present invention can be practiced.

In FIG. 6, a computer system 600 includes one or more processors, such as a processor 604. The processor 604 can be a special purpose or a general purpose digital signal processor. The processor 604 is connected to a communication infrastructure 606 (for example, a bus or network). Various software implementations are described in terms of this exemplary computer system. After reading this description, it will become apparent to a person skilled in the relevant art how to implement the invention using other computer systems and/or computer architectures.

The computer system 600 also includes a main memory 608, preferably random access memory (RAM), and may also include a secondary memory 610. The secondary memory 610 may include, for example, a hard disk drive 612 and/or a removable storage drive 614, representing a floppy disk drive, a magnetic tape drive, an optical disk drive, etc. The removable storage drive 614 reads from and/or writes to a removable storage unit 618 in a well known manner. The removable storage unit 618, represents a floppy disk, magnetic tape, optical disk, etc. which is read by and written to by removable storage drive 614. As will be appreciated, the removable storage unit 618 includes a computer usable storage medium having stored therein computer software and/or data.

In alternative implementations, the secondary memory 610 may include other similar means for allowing computer programs or other instructions to be loaded into the computer system 600. Such means may include, for example, a removable storage unit 622 and an interface 620. Examples of such means may include a program cartridge and cartridge interface (such as that found in video game devices), a removable memory chip (such as an EPROM, or PROM) and associated socket, and the other removable storage units 622 and the interfaces 620 which allow software and data to be transferred from the removable storage unit 622 to the computer system 600.

The computer system 600 may also include a communications interface 624. The communications interface 624 allows software and data to be transferred between the computer system 600 and external devices. Examples of the communications interface 624 may include a modem, a network interface (such as an Ethernet card), a communications port, a PCMCIA slot and card, etc. Software and data transferred via the communications interface 624 are in the form of signals 628 which may be electronic, electromagnetic, optical or other signals capable of being received by the communications interface 624. These signals 628 are provided to the communications interface 624 via a communications path 626. The communications path 626 carries the signals 628 and may be implemented using wire or cable, fiber optics, a phone line, a cellular phone link, an RF link and other communications channels.

In the present application, the terms "computer readable medium" and "computer usable medium" are used to generally refer to media such as the removable storage drive 614, a hard disk installed in the hard disk drive 612, and the signals 628. These computer program products are means for providing software to the computer system 600.

Computer programs (also called computer control logic) are stored in the main memory 608 and/or the secondary memory 610. Computer programs may also be received via the communications interface 624. Such computer programs, when executed, enable the computer system 600 to implement the present invention as discussed herein.

In particular, the computer programs, when executed, enable the processor 604 to implement the processes of the present invention. Accordingly, such computer programs represent controllers of the computer system 600. By way of example, in the embodiments of the invention, the processes/methods performed by signal processing blocks of encoders and/or decoders can be performed by computer control logic. Where the invention is implemented using software, the software may be stored in a computer program product and loaded into the computer system 600 using the removable storage drive 614, the hard drive 612 or the communications interface 624.

CONCLUSION

The present invention provides a method and system for providing real time uniformity illumination measurements and intensity feedback. More specifically, the present invention provides a technique to measure illumination uniformity in real time, which enables active control of uniformity with feedback.

The present invention has been described above with the aid of functional building blocks illustrating the performance of specified functions and relationships thereof. The boundaries of these functional building blocks have been arbitrarily defined herein for the convenience of the description. Alternate boundaries can be defined so long as the specified functions and relationships thereof are appropriately performed.

Any such alternate boundaries are thus within the scope and spirit of the claimed invention. One skilled in the art will recognize that these functional building blocks can be implemented by analog and/or digital circuits, discrete components, application-specific integrated circuits, firmware, processor executing appropriate software, and the like, or any combination thereof. Thus, the breadth and scope of the present invention should not be limited by any of the above-described exemplary embodiments, but should be defined only in accordance with the following claims and their equivalents.

The foregoing description of the specific embodiments will so fully reveal the general nature of the invention that others can, by applying knowledge within the skill of the art (including the contents of the references cited herein), readily modify and/or adapt for various applications such specific embodiments, without undue experimentation, without departing from the general concept of the present invention. Therefore, such adaptations and modifications are intended to be within the meaning and range of equivalents of the disclosed embodiments, based on the teaching and guidance presented herein. It is to be understood that the phraseology or terminology herein is for the purpose of description and not of limitation, such that the terminology or phraseology of the present specification is to be interpreted by the skilled artisan in light of the teachings and guidance presented herein, in combination with the knowledge of one of ordinary skill in the art.

The Detailed Description section should primarily be used to interpret the claims. The Summary and Abstract sections may set forth one or more, but not all exemplary embodiments of the present invention as contemplated by the inventor(s), and thus, are not intended to limit the claims.

What is claimed is:

1. A method for adjusting illumination characteristics of a radiation beam, comprising:
   (a) sampling the beam to produce a first portion of the beam and a second portion of the beam;
   (b) projecting the second portion to a secondary object plane while simultaneously projecting the first portion to a primary object plane;
   (c) measuring an illumination uniformity profile of the second portion; and
   (d) adjusting an illumination uniformity profile of the first portion based on the measured illumination uniformity profile of the second portion.

2. The method of claim 1, wherein steps (b) and (c) are performed substantially simultaneously.

3. The method of claim 1, wherein step (d) comprises:
   determining a correction value to adjust the illumination uniformity profile of the first portion based upon the measured illumination uniformity profile of the second portion; and
   adjusting the illumination uniformity profile of the first portion substantially in real-time in accordance with the correction value.

4. The method of claim 1, wherein step (c) further comprises:
   measuring the illumination uniformity profile of the second portion at the secondary object plane.

5. An apparatus for adjusting illumination characteristics of a radiation beam, comprising:
   an optical system configured to project a first portion of the beam to a primary object plane while simultaneously projecting a second portion of the beam to a secondary object plane;
   a detector positioned at the secondary object plane and configured to measure an illumination uniformity profile of the second portion; and
   a correction system configured to adjust an illumination uniformity profile of the first portion based on the measured illumination profile of the second portion.

6. The apparatus of claim 5, wherein the optical system comprises:
   an optical element configured to receive the beam from an illumination system and generate the first portion and the second portion;
   a primary optical system configured to project the first portion to the primary object plane; and
   a secondary optical system configured to project the second portion to the secondary object plane.

7. The apparatus of claim 5, wherein the correction system comprises:
   a module configured to determine a correction value used to adjust the illumination uniformity profile of the first portion based upon the measured illumination uniformity profile of the second portion; and
   a correction device configured to adjust the illumination uniformity profile of the first portion substantially in real-time in accordance with the correction value.

8. A lithographic apparatus, comprising:
   an illumination system configured to produce a beam of radiation;
   an optical system configured to project a first portion of the beam to a primary object plane while simultaneously projecting a second portion of the beam to a secondary object plane;
   a detector positioned at the secondary object plane to measure an illumination uniformity profile of the second portion;
   a correction system configured to adjust an illumination uniformity profile of the first portion based the measured illumination uniformity profile of the second portion; and
   a projection system configured to project the adjusted first portion to an image plane.

9. The lithographic apparatus of claim 8, wherein the optical system comprises:
   an optical element configured to receive the beam from the illumination system and generate the first portion and the second portion;
   a primary optical system configured to project the first portion to the primary object plane; and
   a secondary optical system configured to project the second portion to the secondary object plane.

10. The lithographic apparatus of claim 9, wherein the primary and secondary optical systems respectively include at least one of a lens and a mirror.

11. The lithographic apparatus of claim 9, wherein the optical element comprises at least one of a beam splitting device or a leaky mirror.

12. The lithographic apparatus of claim 8, wherein the correction system comprises:
- a module to determine a correction value used to adjust the illumination uniformity profile of the first portion based upon the measured illumination uniformity profile of the second portion; and
- a correction device configured to adjust the illumination uniformity profile of the first portion substantially in real-time in accordance with the correction value.

13. The lithographic apparatus of claim 8, further comprising another detector configured to measure an illumination uniformity profile of the first portion at the primary object plane.

14. The lithographic apparatus of claim 13, wherein a comparison between the measured illumination uniformity profiles of the first and second portions is used to create a transfer function that is used to interpret measurements from the first detector.

15. A method for adjusting illumination characteristics of a radiation beam, comprising:
(a) sampling the beam to produce a first portion and a second portion;
(b) projecting the second portion to a pupil plane representative of a pupil fill of an illumination source while simultaneously projecting the first portion to an object plane;
(c) measuring an illumination pupil fill of the second portion; and
(d) adjusting an illumination pupil fill of the first portion based on the measured illumination pupil fill of the second portion.

16. The method of claim 15, wherein steps (b) and (c) are performed substantially simultaneously.

17. The method of claim 15, wherein step (d) comprises:
determining a correction value to adjust the illumination pupil fill of the first portion based upon the measured illumination pupil fill of the second portion; and
adjusting the illumination pupil of the first portion substantially in real-time in accordance with the correction value.

18. The method of claim 15, wherein step (c) further comprises:
measuring the illumination pupil fill of the second portion substantially at the pupil plane.

19. An apparatus for adjusting illumination characteristics of a radiation beam, comprising:
an optical system configured to project a first portion of the beam to an object plane while simultaneously projecting a second portion of the beam to a pupil plane;
a detector positioned at the pupil plane and configured to measure an illumination pupil fill of the second portion; and
a correction system configured to adjust an illumination pupil fill of the first portion based on the measured illumination pupil fill of the second portion.

20. The apparatus of claim 19, wherein the optical system comprises:
an optical element configured to receive the beam from an illumination system and generate the first portion and the second portion;
a primary optical system configured to project the first portion to the object plane; and
a secondary optical system configured to project the second portion to the pupil plane.

21. The apparatus of claim 19, wherein the correction system comprises:
a module configured to determine a correction value to adjust the illumination pupil fill of the first portion based upon the measured illumination pupil fill of the second portion; and
a correction device configured to adjust the illumination pupil fill of the first portion substantially in real-time in accordance with the correction value.

22. A lithographic apparatus, comprising:
an illumination system configured to produce a beam of radiation;
an optical system configured to project a first portion of the beam to an object plane while simultaneously projecting a second portion of the beam to a pupil plane.
a pupil detector positioned at the pupil plane to measure an illumination pupil fill of the second portion; and
a correction system configured to adjust an illumination pupil fill of the first portion based the measured illumination pupil fill of the second portion; and
a projection system configured to project the adjusted first portion to an image plane.

23. The lithographic apparatus of claim 22, wherein the optical system comprises:
an optical element configured to receive the beam from the illumination system and generate the first portion and the second portion;
a first optical system configured to project the first portion to the object plane; and
a second optical system configured to project the second portion to the pupil plane.

24. The lithographic apparatus of claim 23, wherein the first and second optical systems respectively include at least one of a lens and a mirror.

25. The lithography system of claim 23, wherein:
the optical element comprises a beam splitting device; and
the pupil plane detector includes one or more pinholes.

26. The lithography system of claim 25, wherein the beam splitting device includes a leaky mirror.

27. The lithography system of claim 22, wherein the correction system comprises:
a module configured to determine a correction value to adjust the illumination pupil fill of the first portion based upon the measured illumination pupil fill of the second portion; and
a correction device configured to adjust the illumination pupil fill of the first portion substantially in real-time in accordance with the correction value.

28. A computer-readable medium containing instructions for controlling at least one processor by a method comprising:
(a) sampling a beam of radiation to produce a first portion of the beam and a second portion of the beam;
(b) projecting the second portion to a secondary object plane while simultaneously projecting the first portion to a primary object plane;
(c) measuring illumination characteristics of the second portion; and (d) adjusting illumination characteristics of the first portion based on the measured illumination characteristics of the second portion.

29. The method of claim 28, wherein step (d) comprises:

determining a correction value for adjusting the illumination characteristics of the first portion based upon the measured illumination characteristics of the second portion; and adjusting the illumination characteristics of the first portion substantially in real-time in accordance with the correction value.

30. The computer-readable medium of claim 29, wherein the illumination characteristics comprise at least one of an illumination uniformity profile of the beam of radiation or an illumination pupil fill of the beam of radiation.

* * * * *